BEST AVAILABLE COPY T900,009

DEFENSIVE PUBLICATION

UNITED STATES PATENT OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent Office makes no assertion as to the novelty of the disclosed subject matter.

PUBLISHED JULY 18, 1972

900 O.G. 818

T900,009

ULTRAVIOLET ABSORPTIVE MASKS

Kenneth R. Dunham and Marshall E. Yost, both of Kodak Park Works, Rochester, N.Y. 14650

Filed Aug. 23, 1971, Ser. No. 174,223
**Int. Cl. G03c *1/68***
U.S. Cl. 96—115
No Drawing. 14 Pages Specification

Ultraviolet absorptive masks are prepared from light-sensitive elements comprising a support which is transparent to ultraviolet radiation bearing a layer of a light-sensitive polymer which is highly absorptive of ultraviolet radiation. The masks are prepared by imagewise exposing the element to actinic radiation to insolubilize polymer in the exposed areas and developing an ultraviolet absorptive image by removing polymer from the unexposed areas. These masks are employed in the preparation of photoresist images in the same manner as silver halide masks are employed in this art.

Useful polymers include those which have appended to the polymer backbone a moiety derived from a p-(2,5-dihydro - 3 - cyano-2-oxo-4-phenyl - 5 - furylidenemethyl) benzoic acid or benzoyl chloride and a moiety derived from either a p-(2-ethoxycarbonylvinyl)cinnamic acid or cinnamoyl chloride or a p-(2-ethylhexyloxycarbonylvinyl) cinnamic acid or cinnamoyl chloride. Particularly preferred are polymers having the structural formula

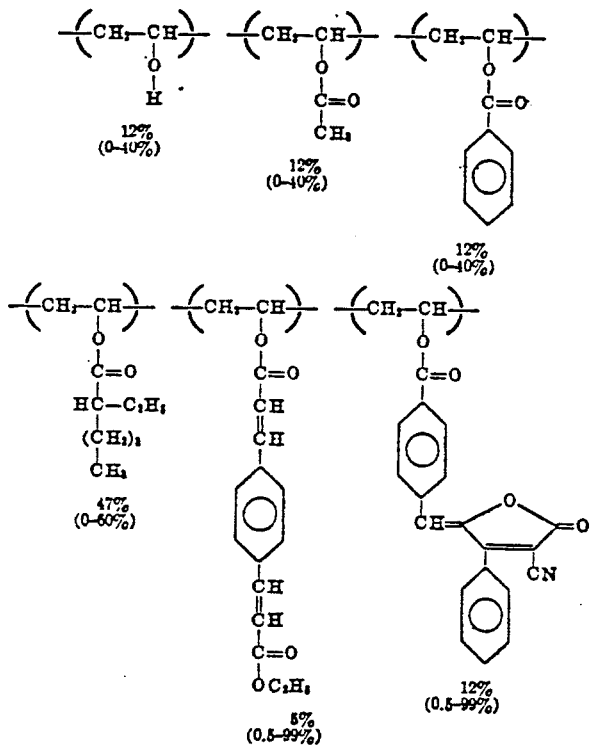

In this structure the preferred mole ratio of the various repeating units is shown directly below the corresponding units and the preferred range for the repeating units is shown therebelow in parentheses.